United States Patent
Chou et al.

(10) Patent No.: US 11,435,237 B2
(45) Date of Patent: Sep. 6, 2022

(54) TEMPERATURE SENSING DEVICE OF INTEGRATED CIRCUIT

(71) Applicants: Yi-Chung Chou, Taipei (TW); Yu-Chin Chen, Hsinchu (TW); Tzu-I Huang, Hsinchu (TW)

(72) Inventors: Yi-Chung Chou, Taipei (TW); Yu-Chin Chen, Hsinchu (TW); Tzu-I Huang, Hsinchu (TW)

(73) Assignee: ITE Tech. Inc., Hsinchu (TW)

( * ) Notice: Subject to any disclaimer, the term of this patent is extended or adjusted under 35 U.S.C. 154(b) by 126 days.

(21) Appl. No.: 16/904,579

(22) Filed: Jun. 18, 2020

(65) Prior Publication Data

US 2021/0318175 A1 Oct. 14, 2021

(30) Foreign Application Priority Data

Apr. 14, 2020 (TW) ................................. 109112486

(51) Int. Cl.
*G01K 7/00* (2006.01)
*G01K 7/01* (2006.01)
*G01K 1/18* (2006.01)
*G01K 7/20* (2006.01)

(52) U.S. Cl.
CPC ................. *G01K 7/01* (2013.01); *G01K 1/18* (2013.01); *G01K 7/20* (2013.01)

(58) Field of Classification Search
CPC combination set(s) only.
See application file for complete search history.

(56) References Cited

U.S. PATENT DOCUMENTS

| | | | |
|---|---|---|---|
| 5,961,215 A * | 10/1999 | Lee | G01K 7/01 374/178 |
| 6,959,258 B2 | 10/2005 | Smith et al. | |
| 7,239,002 B2 | 7/2007 | Ohkubo et al. | |
| 7,741,692 B2 | 6/2010 | Ohkubo et al. | |
| 2014/0291677 A1* | 10/2014 | Le Neel | G01L 19/0092 257/48 |
| 2018/0058943 A1* | 3/2018 | Ge | G01K 7/01 |
| 2019/0078941 A1* | 3/2019 | Mahon | H03K 17/14 |

FOREIGN PATENT DOCUMENTS

| | | |
|---|---|---|
| TW | 200941720 | 10/2009 |
| TW | 201909423 | 3/2019 |
| TW | 201923319 | 6/2019 |

OTHER PUBLICATIONS

"Office Action of Taiwan Counterpart Application", dated Feb. 25, 2021, p. 1-p. 5.

* cited by examiner

*Primary Examiner* — Lisa M Caputo
*Assistant Examiner* — Nasir U. Ahmed
(74) *Attorney, Agent, or Firm* — JCIPRNET

(57) ABSTRACT

The invention provides a temperature sensing device of an integrated circuit. The integrated circuit includes a plurality of stacked metal wire layers, and the temperature sensing device includes a first metal sheet, a first via and a second via. The first metal sheet is disposed between the first metal wire layer and the second metal wire layer of the metal wire layers. The first via and the second via are used to connect the first metal sheet and the first metal wire layer, wherein a temperature sensing signal enters the first metal sheet through the first via and leaves the first metal sheet through the second via to measure the temperature of the integrated circuit.

5 Claims, 2 Drawing Sheets

TEMPERATURE SENSING DEVICE OF INTEGRATED CIRCUIT

CROSS-REFERENCE TO RELATED APPLICATION

This application claims the priority benefit of Taiwan application serial no. 109112486, filed on Apr. 14, 2020. The entirety of the above-mentioned patent application is hereby incorporated by reference herein and made a part of this specification.

BACKGROUND

Technical Field

The invention relates to a semiconductor technology, and particularly to a temperature sensing device of an integrated circuit.

Description of Related Art

With the progress of process technology, the size of integrated circuits (IC) has become smaller and smaller, and the integration of circuitry has been improved. Until now, the industry has developed a system on a chip (SOC) that integrates electronic systems on a single chip. However, since the electronic elements inside the chip are very closely arranged, the heat energy generated during the operation of the electronic components will seriously affect the performance of the SOC, it is essential to monitor the temperature change inside the SOC.

SUMMARY

The present invention provides a temperature sensing device of an integrated circuit, which has a simple structure and is easy to manufacture and can accurately measure the internal temperature of the integrated circuit.

An embodiment of the invention provides a temperature sensing device of an integrated circuit. The integrated circuit includes a plurality of stacked metal wire layers, and the temperature sensing device comprises a first metal sheet, a first via and a second via. The first metal sheet is disposed between the first metal wire layer and the second metal wire layer of the metal wire layers. The first via and the second via are used to connect the first metal sheet, and the first metal wire layer, wherein a temperature sensing signal enters the first metal sheet through the first via and leaves the first metal sheet through the second via to measure the temperature of the integrated circuit.

In an embodiment of said temperature sensing device of the invention, the second metal wire layer is adjacent to the first metal wire layer and is located below the first metal wire layer, wherein the first metal wire layer is the uppermost layer or the second upper layer among the plurality of metal wire layers.

In an embodiment of said temperature sensing device of the invention, a material of the first metal sheet comprises Ti, TiN, AlCu, or a mixture of said materials.

In an embodiment of said temperature sensing device of the invention, the sheet resistance of the first metal sheet is higher than the sheet resistances of the plurality of metal wire layers.

In an embodiment of said temperature sensing device of the invention, a process resolution adapted to the integrated circuit falls within a range of 90 nm to 0.18 μm.

In an embodiment of said temperature sensing device of the invention, said temperature sensing device further includes a second metal sheet and a dielectric layer. The second metal sheet is located below the first metal sheet and disposed on a surface of the second metal wire layer facing the first metal wire layer. The dielectric layer is disposed between the second metal sheet and the first metal sheet.

In an embodiment of said temperature sensing device of the invention, an electrode material of a capacitor of the integrated circuit is the same as the material of the first metal sheet and the second metal sheet.

In an embodiment of said temperature sensing device of the invention, the temperature sensing signal is a measurement result of the resistance of the first metal sheet.

Based on the above, an embodiment of the present invention provides a temperature sensing device of an integrated circuit. The temperature sensing device includes a first metal sheet formed between a first metal wire layer and a second metal wire layer in the integrated circuit and a first via and a second via connecting the first metal sheet and the first metal wire layer. The temperature sensing signal enters the first metal sheet from the first metal wire layer through the first via and leaves the first metal sheet through the second via to return to the first metal wire layer. The temperature sensing signal senses the reaction of the first metal sheet to the temperature, thereby obtaining the internal temperature of the integrated circuit. The invention provides a temperature sensing device with a simple structure and capable of accurately respond to the heat. Also, the temperature sensing device of the present invention is simple to manufacture and can avoid the burden of the manufacturing process.

To make the aforementioned more comprehensible, several embodiments accompanied with drawings are described in detail as follows.

BRIEF DESCRIPTION OF THE DRAWINGS

The accompanying drawings are included to provide a further understanding of the disclosure and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
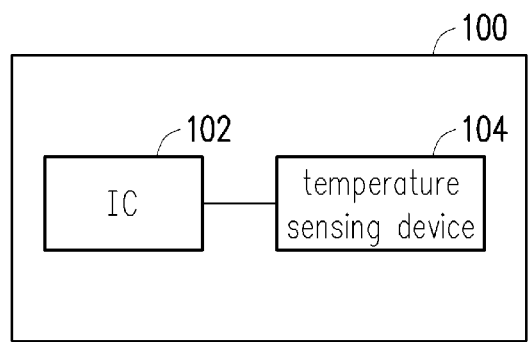
FIG. 1 is a schematic diagram of a system on chip according to an embodiment of the invention.

FIG. 1 is a schematic diagram of a system on chip according to an embodiment of the invention. Please refer to FIG. 1, the system on chip (SOC) 100 includes at least one integrated circuit (IC) 102 and a temperature sensing device 104. The integrated circuit 102 includes a plurality of metal wire layers arranged on the substrate. These metal wire layers are stacked on the substrate and are electrically connected in a vertical direction through a plurality of vias. These metal wire layers have wire patterns, which are used to provide interconnection for the power supply, transistors, capacitors, or other electronic elements of the integrated circuit 102. In the embodiment, the temperature sensing device 104 is disposed between these metal wire layers to measure the internal temperature of the integrated circuit 102.

Figure 2:
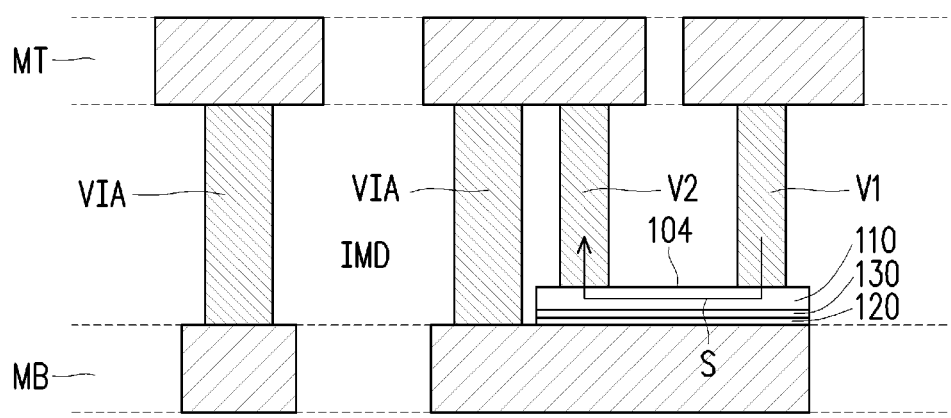
FIG. 2 is a cross-sectional view of the structure of a temperature sensing device according to an embodiment of the invention.

FIG. 2 is a cross-sectional view of the structure of a temperature sensing device according to an embodiment of the invention. The embodiment of FIG. 1 can be applied to the embodiment of FIG. 2. Please refer to FIG. 2 in combination with FIG. 1, the first metal wire layer MT and the second metal wire layer MB are two of the plurality of metal wire layers of the integrated circuit 102. The via VIA is used to connect the first metal wire layer MT and the second metal wire layer MB. The second metal wire layer MB is adjacent to the first metal wire layer MT, and the second metal wire layer MB is located below the first metal wire layer MT. Specifically, the first metal wire layer MT and the second metal wire layer MB are two adjacent upper and lower layers of the plurality of metal wire layers and the second metal wire layer MB is closer to the substrate than the first metal wire layer MT. In this embodiment, the first metal wire layer MT is the uppermost layer (the farthest away from the substrate) or the second upper layer (the second farthest metal wire layer from the substrate) among the metal wire layers. When the first metal wire layer MT is the uppermost metal wire layer, the second metal wire layer MB is the second upper metal wire layer. When the first metal wire layer MT is the second upper layer among the metal wire layers, the second metal wire layer MB is the third-highest metal wire layer. The first metal wire layer MT and the second metal wire layer MB are separated by an inter-metal dielectric layer IMD. A via VIA is provided in the inter-metal dielectric layer IMD to allow electronic signals to be transmitted between the first metal wire layer MT and the second metal wire layer MB.

It should be mentioned that the surfaces of the plurality of metal wire layers of the integrated circuit 102 (including the first metal wire layer MT and the second metal wire layer MB) may further include an etching stop layer or a barrier layer, etc. These are not shown in FIG. 2. Those skilled in the art can understand the structure of the metal wire layers in the integrated circuit 102 according to the prior art and common knowledge.

In FIG. 2, the temperature sensing device 104 includes at least a first metal sheet 110, a first via V1, and a second via V2. The first metal sheet 110 is disposed between the first metal wire layer MT and the second metal wire layer MB of the integrated circuit 102. The first via V1 and the second via V2 are configured to connect the first metal sheet 110 and the first metal wire layer MT, wherein a temperature sensing signal S enters the first metal sheet 110 through the first via V1 and leaves the first metal sheet 110 through the second via V2. The temperature sensing signal S is used to measure the internal temperature of the integrated circuit 102.

In particular, the thickness of the first metal sheet 110 is thinner than these metal wire layers, and the material is different from the material of the metal wire layers of the integrated circuit 102. The material of the first metal sheet 110 may include titanium (Ti), titanium nitride (TiN), aluminum copper (AlCu), or a mixture of the said materials, etc., but is not limited thereto. The sheet resistance of the first metal sheet 110 is higher than the sheet resistances of these metal wire layers. Besides, the material of the first metal sheet 110 also has a high rate of resistance variation with temperature. In an embodiment, the sheet resistance of the first metal sheet 110 is 11.5 $\Omega$/sq, and the rate of resistance variation with temperature is 0.005%/C. When the temperature changes, the sheet resistance of the first metal sheet 110 will also change significantly. Therefore, the temperature sensing signal S will change significantly in response to the resistance (affected by temperature) after passing through the first metal sheet 110 to resist noise interference. In contrast, the voltage between the base (B) and the emitter (E) of the bipolar junction transistor (BJT) varies little with temperature, so it is susceptible to noise interference. The B-E voltage cannot accurately respond to the temperature change.

In the present embodiment, the temperature sensing device 104 further includes a second metal sheet 120 and a dielectric layer 130. The second metal sheet 120 is located below the first metal sheet 110 and is disposed on the surface of the second metal wire layer MB facing the first metal wire layer MT. The dielectric layer 130 is disposed between the second metal sheet 120 and the first metal sheet 110. The first metal sheet 110, the second metal sheet 120, and the dielectric layer 130 of the temperature sensing device 104 may constitute a metal-insulator-metal (MIM) capacitor.

In this embodiment, the process resolution adapted to the integrated circuit 102 falls within a range of 90 nm to 0.18 μm. When the circuit design of the integrated circuit 102 includes a capacitor, the electrode material of the capacitor of the integrated circuit 102 is the same as the material of the first metal sheet 110 and the second metal sheet 120. The dielectric material of the capacitor can also be the same as the dielectric layer 130. That is, the structure of the temperature sensing device 104 may be the same as the structure of the capacitor of the integrated circuit 102. Therefore, in the semiconductor manufacturing process of the integrated circuit 102, it is convenient to manufacture the temperature sensing device 104 together with the manufacturing of the MIM capacitor. Thus, it is easy to simplify the manufacturing process and save production costs.

In particular, the present invention does not limit the capacitance value between the first metal sheet 110 and the second metal sheet 120.

Figure 3A:
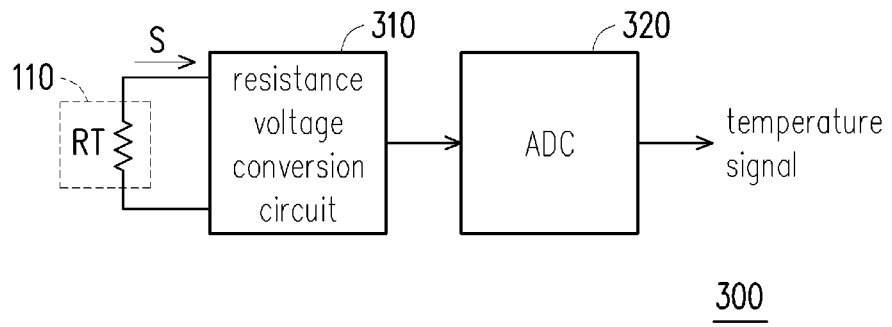
FIG. 3A is a block diagram of a temperature sensing device according to another embodiment of the invention.

FIG. 3A is a block diagram of a temperature sensing device according to another embodiment of the invention. Please refer to FIG. 3A, the temperature sensing device 300 is suitable for the embodiments of FIGS. 1 and 2. Compared with the temperature sensing device 104, the temperature sensing device 300 further includes a resistance voltage conversion circuit 310 and an analog-to-digital converter (ADC) 320. In this embodiment, the temperature sensing signal S is the measurement result of the resistance RT of the first metal sheet 110. The resistance voltage conversion circuit 310 receives the temperature sensing signal S from the temperature sensing device 104, converts the temperature sensing signal S into a voltage signal, and provides it to the ADC 320. Finally, the ADC 320 outputs a temperature signal in the form of a digital signal.

Figure 3B:
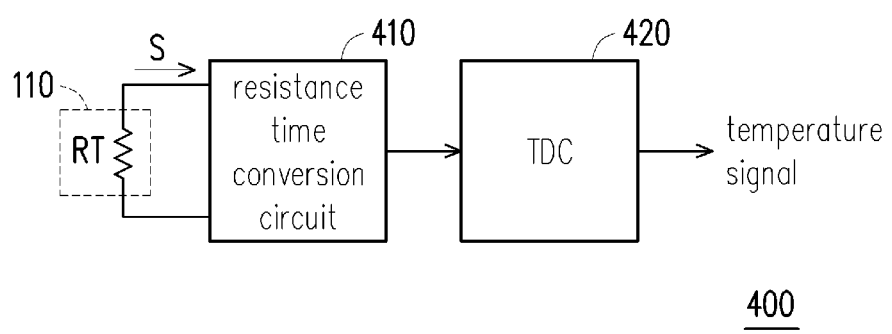
FIG. 3B is a block diagram of a temperature sensing device according to another embodiment of the invention.

FIG. 3B is a block diagram of a temperature sensing device according to another embodiment of the invention. Please refer to FIG. 3B, the temperature sensing device 400 is suitable for the embodiments of FIGS. 1 and 2. Compared with the temperature sensing device 104, the temperature sensing device 400 further includes a resistance time conversion circuit 410 and a time-to-digital converter (TDC) 420. In this embodiment, the temperature sensing signal S is the result of measuring the resistance RT of the first metal sheet 110. The resistance time conversion circuit 410 receives the temperature sensing signal S and correspondingly outputs a frequency signal to the TDC 420. Next, the TDC 420 outputs a temperature signal in the form of a digital signal.

It is added that, because the first metal sheet 110 of this embodiment is selected to use a material with a high rate of resistance variation with temperature, it can reduce the resolution requirements for the ADC 320 or TDC 420 and the temperature of the integrated circuit 102 is still accurately obtained.

In summary, the embodiments of the present invention provide a temperature sensing device of an integrated circuit. The temperature sensing device includes a first metal sheet formed between a first metal wire layer and a second metal wire layer in the integrated circuit, a first via and a second via connecting the first metal sheet and the first metal wire layer. The embodiments of the present invention accurately measure the temperature of the integrated circuit according to the result of the temperature sensing signal passing through the first metal sheet. Since the semiconductor manufacturing process of the integrated circuit includes the step of forming an electrode between the metal wire layers when manufacturing the capacitor, the temperature sensing device of the present invention can be generated together in the process of forming the electrode. Therefore, it can reduce the manufacturing burden of the integrated circuit.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A temperature sensing device of an integrated circuit, wherein the integrated circuit comprises a plurality of metal wire layers stacked vertically and the temperature sensing device comprises:

a first metal sheet, disposed between a first metal wire layer and a second metal wire layer of the plurality of metal wire layers;

a first via and a second via, configured to connect the first metal sheet and the first metal wire layer, a second metal sheet, located below the first metal sheet and disposed on a surface of the second metal wire layer facing the first metal wire layer; and a dielectric layer, disposed between the second metal sheet and the first metal sheet, wherein a temperature sensing signal enters the first metal sheet through the first via and leaves the first metal sheet through the second via for measuring the temperature of the integrated circuit;

wherein an electrode material of a capacitor of the integrated circuit is the same as the material of the first metal sheet and the second metal sheet;

wherein the sheet resistance of the first metal sheet is higher than the sheet resistances of the plurality of metal wire layers.

2. The temperature sensing device as claimed in claim 1, wherein the second metal wire layer is adjacent to the first metal wire layer and is located below the first metal wire layer, wherein the first metal wire layer is the uppermost layer or the second upper layer among the plurality of metal wire layers.

3. The temperature sensing device as claimed in claim 1, wherein a material of the first metal sheet comprises Ti, TiN, AlCu, or a mixture of said materials.

4. The temperature sensing device as claimed in claim 1, wherein a process resolution adapted to the integrated circuit falls within a range of 90 nm to 0.18 μm.

5. The temperature sensing device as claimed in claim 1, wherein the temperature sensing signal is a measurement result of the resistance of the first metal sheet.

\* \* \* \* \*